United States Patent
Wamura et al.

(10) Patent No.: US 10,053,776 B2
(45) Date of Patent: Aug. 21, 2018

(54) METHOD OF DETOXIFYING EXHAUST PIPE AND FILM FORMING APPARATUS

(71) Applicant: TOKYO ELECTRON LIMITED, Tokyo (JP)

(72) Inventors: Yu Wamura, Oshu (JP); Fumiaki Hayase, Oshu (JP); Masahiko Kaminishi, Oshu (JP); Kosuke Takahashi, Oshu (JP); Yu Sasaki, Oshu (JP); Hiroko Sasaki, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 316 days.

(21) Appl. No.: 15/003,138

(22) Filed: Jan. 21, 2016

(65) Prior Publication Data

US 2016/0220953 A1  Aug. 4, 2016

(30) Foreign Application Priority Data

Feb. 2, 2015 (JP) .................... 2015-018773

(51) Int. Cl.
| | | |
|---|---|---|
| C23C 16/455 | (2006.01) | |
| C23C 16/44 | (2006.01) | |
| B08B 17/00 | (2006.01) | |
| B01D 53/00 | (2006.01) | |
| C23C 16/458 | (2006.01) | |
| B01D 53/54 | (2006.01) | |
| B01D 53/72 | (2006.01) | |
| B01D 53/76 | (2006.01) | |

(52) U.S. Cl.
CPC .......... C23C 16/4584 (2013.01); B01D 53/54 (2013.01); B01D 53/72 (2013.01); B01D 53/76 (2013.01); C23C 16/4412 (2013.01); C23C 16/45551 (2013.01); B01D 2251/104 (2013.01); B01D 2258/0216 (2013.01)

(58) Field of Classification Search
CPC .......... C23C 16/4584; C23C 16/45551; C23C 16/4408; C23C 16/4412; B01D 53/54; B01D 53/72; B01D 53/76; B01D 2251/104; B01D 2258/0216; C23F 15/00; C23F 15/005; B08B 17/00; F16L 58/00
See application file for complete search history.

(56) References Cited

U.S. PATENT DOCUMENTS

| | | | | |
|---|---|---|---|---|
| 5,584,963 | A * | 12/1996 | Takahashi | C23C 16/4405 134/22.1 |
| 5,746,841 | A * | 5/1998 | Koike | C23C 8/14 148/280 |
| 6,277,347 | B1 * | 8/2001 | Stearns | B01D 53/007 204/157.3 |
| 6,322,756 | B1 * | 11/2001 | Arno | B01D 53/14 422/171 |
| 2005/0082001 | A1 | 4/2005 | Sugiura | |
| 2007/0184188 | A1 * | 8/2007 | Kim | C23C 16/4405 427/248.1 |
| 2015/0031204 | A1 * | 1/2015 | Sasaki | H01L 21/28556 438/685 |

FOREIGN PATENT DOCUMENTS

| | | | | |
|---|---|---|---|---|
| JP | 2001 104 825 A | * | 4/2001 | ............... B03C 3/40 |
| JP | 2002-334869 A | | 11/2002 | |
| JP | 2009209434 A | | 9/2009 | |
| JP | 201056470 A | | 3/2010 | |
| JP | 2016 012 701 A | * | 1/2016 | ............... H01L 21/318 |

* cited by examiner

*Primary Examiner* — Timothy C Vanoy
(74) *Attorney, Agent, or Firm* — Nath, Goldberg & Meyer; Jerald L. Meyer

(57) ABSTRACT

A method of detoxifying an exhaust pipe in a film forming apparatus configured to supply a raw material gas contending a harmful component and a reaction gas capable of generating a harmless reaction product by reaction with the raw material gas into a process chamber to perform a film forming process on a substrate while independently exhausting the raw material gas and the reaction gas from a raw material exhaust pipe and a reaction gas exhaust pipe connected to the process chamber, respectively, is provided. The method includes supplying the reaction gas into the raw material exhaust pipe to detoxify an interior of the raw material exhaust pipe during a predetermined period in which the film forming apparatus is operated and the film forming process is not performed.

12 Claims, 15 Drawing Sheets

FIG. 9

| Tool Status | Wafer transfer | 1st recipe | | | Wafer transfer | 2nd recipe | | |
|---|---|---|---|---|---|---|---|---|
| Recipe Step | | Pre Depo | Depo | Post Depo | | Pre Depo | Depo | Post Depo |
| Time | 2min | 2.5min ; x min | x min | x min ; 0.5min | 3min | 2.5min ; x min | x min | x min ; 0.5min |
| To Chamber | | | ↑ | | | | ↑ | |
| To Atmosphere vent | | ↑ | | ↑ | | ↑ | | ↑ |
| To Exhaust line | ⇧ | | | | ⇧ | | | ⇧ | t1 t2 t3 t4 t5 t6 t7 t8 t9 t10 t11 t12 t13 t14

FIG. 12

| Popular name | Molecular formula | Name |
|---|---|---|
| TMA | $(CH_3)_3Al$ | tri(methyl)aluminum |
| ZyALD (Registered trademark) | $C_{11}H_{23}N_3Zr$ | tri(dimethylamino)cyclopentadienylzirconium |
| TIMCTA | $CH_3C_5H_4Ti[N(CH_3)_2]_3$ | methylcyclopentadienyltitaniumtrisdimethylamide |
| 3DMASi | $[(CH_3)_2N]_3SiH$ | tris(dimethylamino)silane |
| TEMAZ | $[CH_3CH_2(CH_3)N]_4Zr$ | tetrakis(N-ethylmethylamino)zirconium |
| TEMAH | $[CH_3CH_2(CH_3)N]_4Hf$ | tetrakis(N-ethylmethylamino)hafnium |
| TDMAH | $Hf[N(CH_3)_2]_4$ | tetrakis(dimethylamino)hafnium |
| TIMCTA | $CH_3C_5H_4Ti[N(CH_3)_2]_3$ | methylchlcyclopentadienyltris(dimethylamino)titane |
| TDMAT | $[(CH_3)_2N]_4Ti$ | tetrakis(N,N-dimehtylamino)titanium |

FIG. 13

| Popular name | Process reaction formula | |
|---|---|---|
| | $O_3$ | $H_2O$ |
| TMA | $2Al(CH_3)_3 + 8O_3 \rightarrow Al_2O_3 + 6CO_2 + 9H_2O$<br>$[O_2: 2Al(CH_3)_3 + 18O_2 \rightarrow Al_2O_3 + 3CO_2 + 9H_2O]$ | $H_2O: Al(CH_3)_3 + H_2O \rightarrow Al(OH)_3 + 3CH_3OH$ |
| ZyALD (Registered trademark) | $Zr(C_5H_5)[N(CH_3)_2]_3 + O_3 \rightarrow ZrO_2N(CH_3)_2 + 8/3O_3$<br>$\rightarrow NO + 2CO_2 + 3H_2O$ | $Zr(C_5H_5)[N(CH_3)_2]_3 + H_2O \rightarrow$<br>$Zr(NMe_2)x(C_5H_6)y(OH)z + NMe_2H$ (Estimated) |
| TiMCTA | $MeCpTi(NMe_2)_3 + O_3 \rightarrow TiO_2 + MeCpH$ (which might further breakdown in part to $CO_2$ and $H_2O$) + $NMe_2H$ (plus further breakdown products possibly) | $MeCpTi(NMe_2)_3 + H_2O \rightarrow TiO_2 + MeCpH + NMe_2H$ |
| 3DMASi | $Si[N(CH_3)_2]_3H + O_3 \rightarrow SiO_2N(CH_3)_2 + 8/3O_3$<br>$\rightarrow NO + 2CO_2 + 3H_2O$ | $Si[N(CH_3)_2]_3H + 3H_2O \rightarrow Si(MeN)x(OH)yHz + H_2$<br>$+ Me_2H$ |

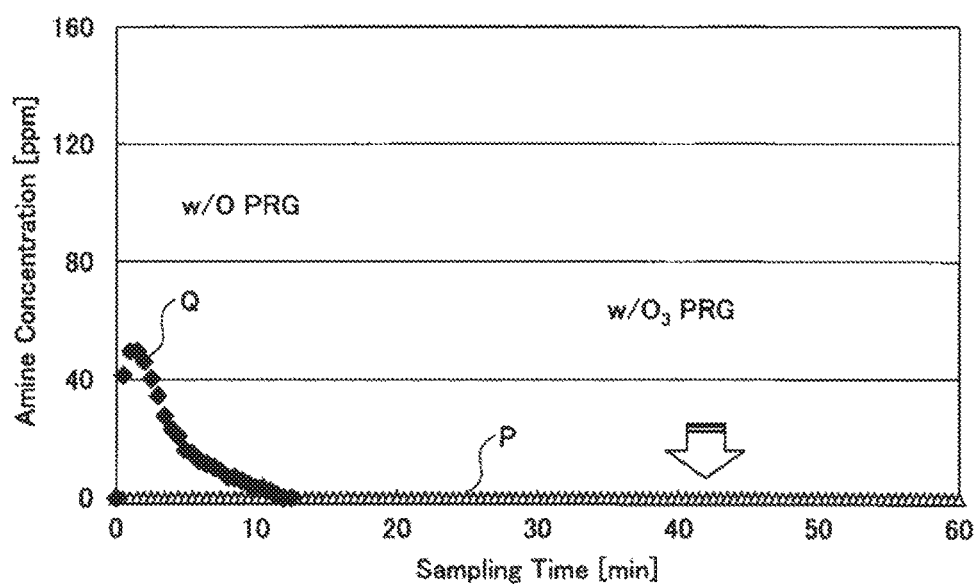

METHOD OF DETOXIFYING EXHAUST PIPE AND FILM FORMING APPARATUS

CROSS-REFERENCE TO RELATED APPLICATION

This application claims the benefit of Japanese Patent Application No. 2015-018773, filed on Feb. 2, 2015 in the Japan Patent Office, the disclosure of which is incorporated herein in its entirety by reference.

TECHNICAL FIELD

The present disclosure relates to a method of detoxifying an exhaust pipe and a film forming apparatus.

BACKGROUND

Conventionally, a method and apparatus for forming a silicon nitride film, and a cleaning pre-processing method of the forming apparatus, which are capable of suppressing generation of hydrogen chloride during maintenance operations, have been known.

This forming apparatus includes a reaction tube for forming a silicon nitride film on a semiconductor wafer by supplying hexachlorodisilane and ammonia, and an exhaust pipe connected to the reaction tube. Further, before the exhaust pipe is disassembled and cleaned, the reaction tube is heated. to 500 to 900 degrees C. by a temperature rising heater, and the exhaust pipe and a valve are heated to 100 to 200 degrees C. by an exhaust pipe heater. And, ammonia, is supplied from a process gas introduction pipe. In this manner, by heating the exhaust pipe and the valve by the exhaust pipe heater, an ammonium chloride may be maintained at a vaporizable temperature and generation of a hydrogen chloride due to hydrolysis may be suppressed.

However, since properties of harmful gases generated during the maintenance are different from each other according to types of films to be formed, there may be a process that cannot suppress generation of a harmful gas even though the exhaust pipe is heated. In such a case, a method different from the foregoing method is required to suppress generation of a harmful gas.

Further, even though a harmful gas is suppressed, if substrate processing is stopped to suppress a harmful gas and a process is performed to suppress the harmful gas for a long period of time, a down time is lengthened to degrade productivity of the substrate processing.

SUMMARY

Some embodiments of the present disclosure provide a method of detoxifying an exhaust pipe capable of detoxifying an exhaust pipe of a raw material gas without having to stop a film forming process when a reaction product based on a reaction between a raw material gas and a reaction gas is harmless even though the raw material gas contains a harmful component, and a film forming apparatus.

According to one embodiment of the present disclosure, a method of detoxifying an exhaust pipe in a film forming apparatus configured to supply a raw material gas containing a harmful component and a reaction gas capable of generating a harmless reaction product by reaction with the raw material gas into a process chamber to perform a film forming process on a substrate while independently exhausting the raw material gas and the reaction gas from a raw material exhaust pipe and a reaction gas exhaust pipe connected to the process chamber includes supplying the reaction gas into the raw material exhaust pipe to detoxify an interior of the raw material exhaust pipe during a predetermined period in which the film forming apparatus is operated and the film forming process is not performed.

According to another embodiment of the present disclosure, a film forming apparatus includes a process chamber, a raw material gas supply region formed within the process chamber and configured such that a raw material gas containing a harmful component s supplied thereto, a reaction gas supply region partitioned with the raw material gas supply region within the process chamber and configured such that a reaction gas capable of generating a harmless reaction product by reaction with the raw material gas is supplied thereto, a raw material gas exhaust pipe connected to a point that communicates with the raw material gas supply region of the process chamber, a reaction gas exhaust pipe connected to a point that communicates with the reaction gas supply region of the process chamber, a raw material gas supply part configured to supply the raw material gas to the raw material gas supply region, a reaction gas supply part configured to supply the reaction gas to the reaction gas supply region, a reaction gas supply source connected to the reaction gas supply part, a bypass pipe configured to connect the reaction gas supply source to the raw material exhaust pipe, a connection switching part configured to switch a connection of the reaction gas supply source to the reaction gas supply part or to the bypass pipe; and a control part configured to control a connection switching operation of the connection switching part.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a timing chart illustrating a sequence of an example of a method for detoxifying an exhaust pipe according to an embodiment of the present disclosure.

FIG. 12 is a diagram illustrating an example of raw material gases that are applicable to the method for detoxifying an exhaust pipe arid the film forming apparatus according to the present embodiment.

FIG. 13 is a diagram illustrating a reaction formula of some of the raw material gases illustrated in FIG. 12 with ozone.

FIG. 15 is a diagram illustrating a result of performing the method for detoxifying an exhaust pipe according to the present embodiment.

DETAILED DESCRIPTION

Hereinafter, embodiments of the present disclosure will be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and elements have not been described in detail so as not o unnecessarily obscure aspects of the various embodiments.

First, an example of a film forming apparatus according to embodiment of the present disclosure will be described with reference to FIGS. 1 to 5. The film forming apparatus according to an embodiment of the present disclosure is a film forming apparatus to which the method for detoxifying an exhaust pipe according to an embodiment of the present disclosure is appropriately applicable. Here, the film forming apparatus ay be a film forming apparatus using a so-called rotary table-type susceptor (to be described later) and a film forming apparatus for performing film formation on surfaces of a plurality of substrates by supplying a process gas containing a raw material gas toward a predetermined supply region will be describe as an example. Also, it may not be essentially required that the susceptor on which a substrate is loaded is a rotary table-type susceptor and may be applicable to various types of film forming apparatuses using a nozzle.

Figure 1:
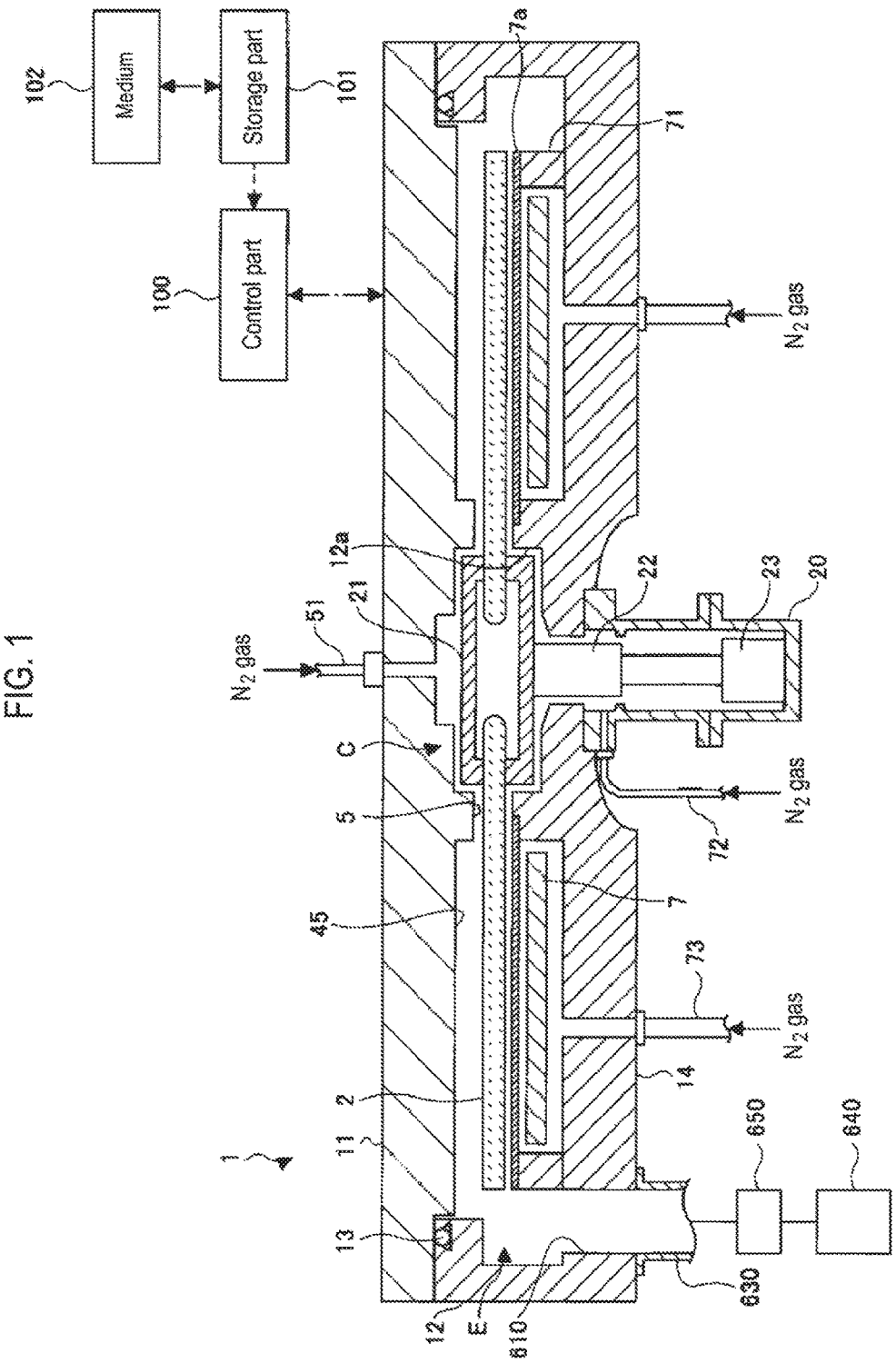
FIG. 1 is a cross-sectional view illustrating an example of a film forming apparatus that is applicable to a film forming method according to an embodiment of the present disclosure.
Figure 2:
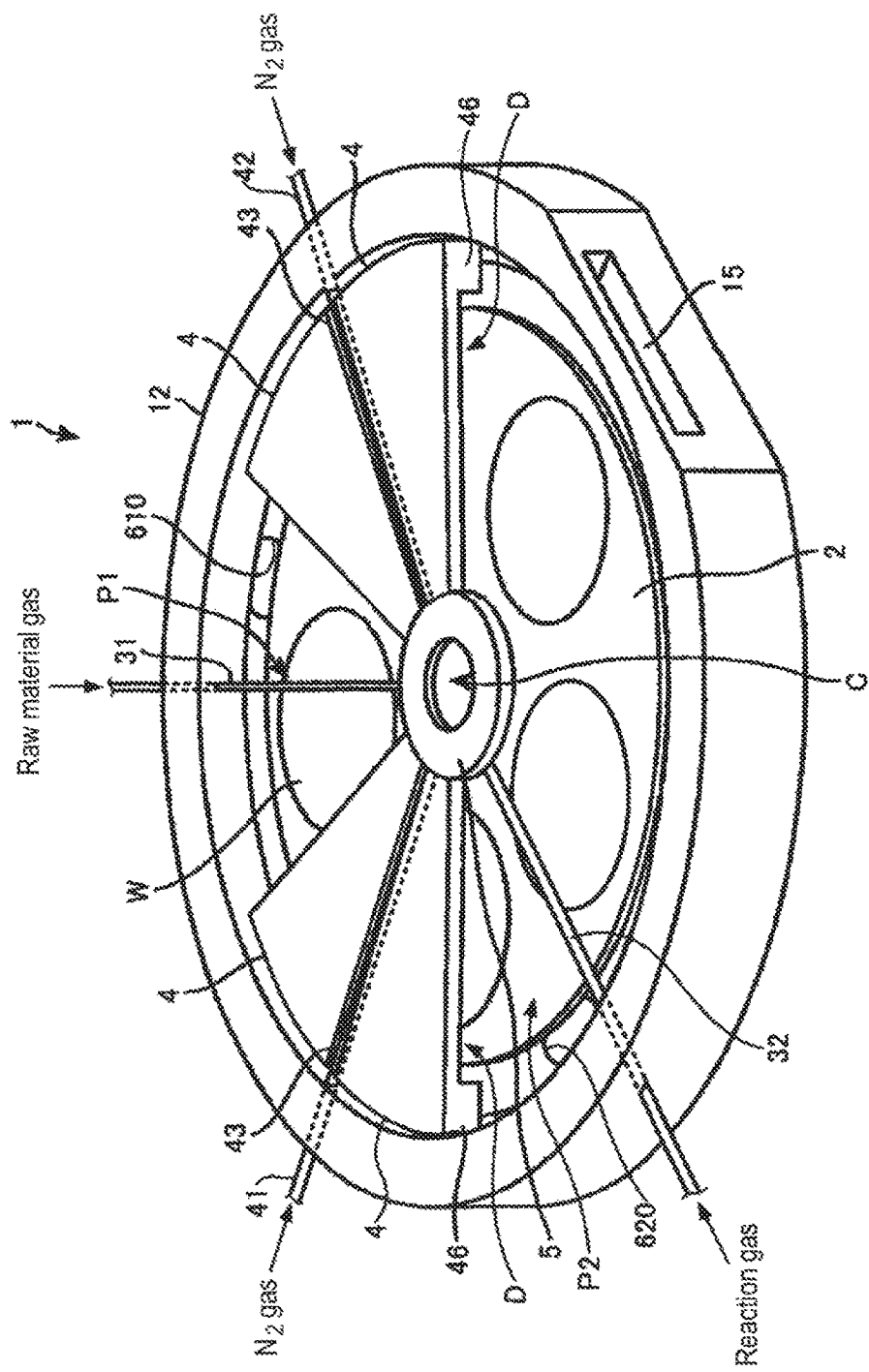
FIG. 2 is a perspective view illustrating an internal structure of a process chamber of the film forming apparatus of FIG. 1.
Figure 3:
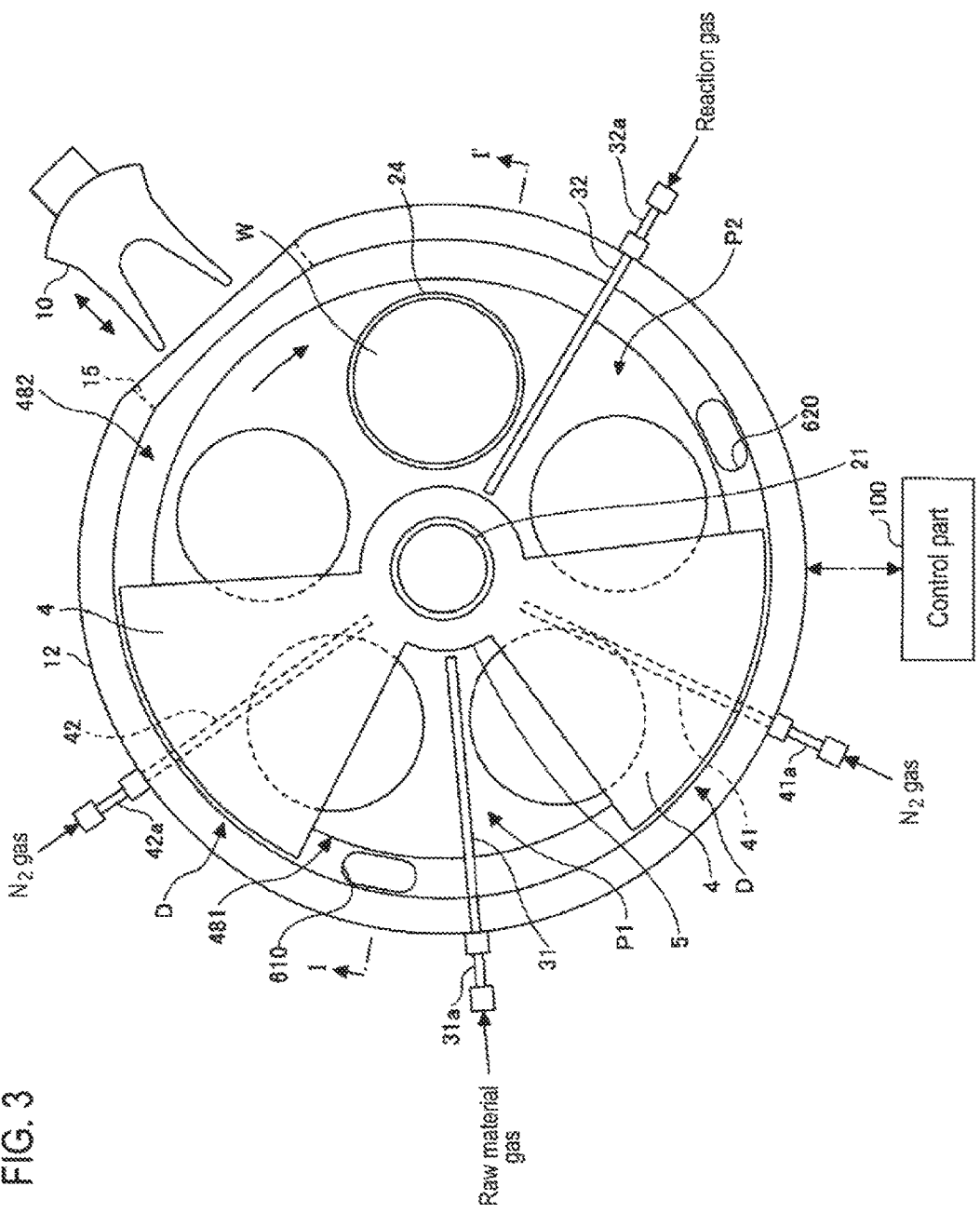
FIG. 3 is a schematic top view illustrating the internal structure of a process chamber of the film forming apparatus of FIG. 1.

FIG. 1 is a cross-sectional view of the film forming apparatus, and illustrates a cross-section taken along line 1-1' of FIG. 3. FIGS. 2 and 3 are views illustrating an internal structure of a process chamber 1 (to be described later). In FIGS. 2 and 3, illustration of a ceiling pate 11 (to be described later) is omitted for the convenience of description.

Figure 4:
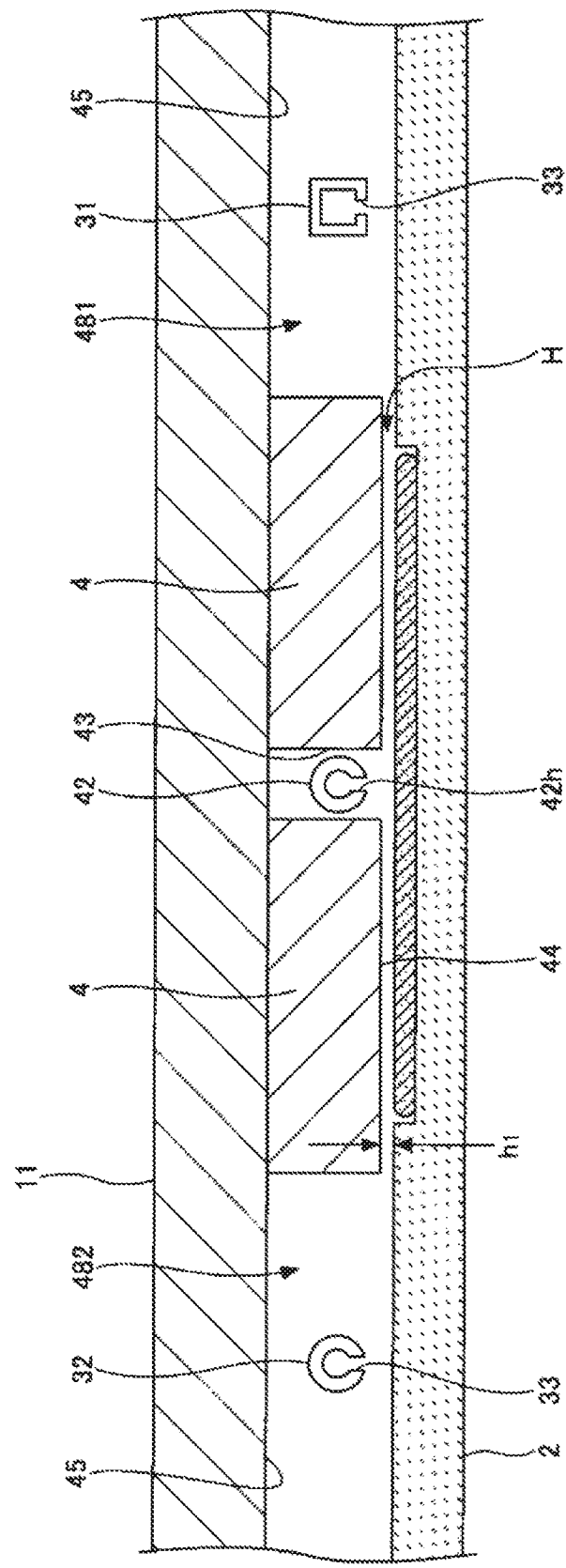
FIG. 4 is a partial cross-sectional view of the film forming apparatus of FIG. 1.
Figure 5:
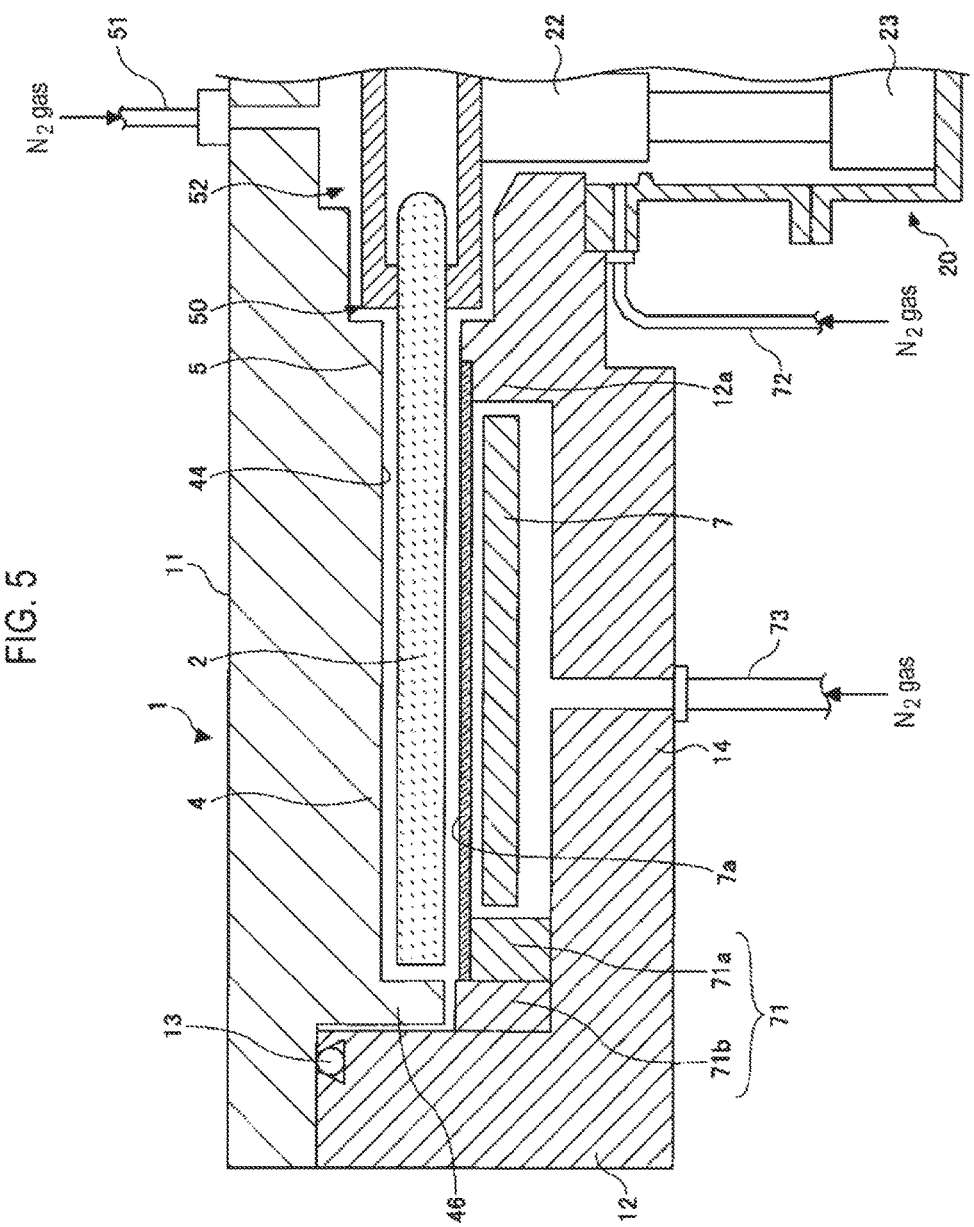
FIG. 5 is another partial cross-sectional view of the film forming apparatus of FIG. 1.

FIG. 4 is a cross-sectional view of the process chamber 1 taken along a concentric circle of the susceptor 2 (to be described later) from a process gas nozzle 31 (to he described later) to a process gas nozzle 32 (to be described later). FIG. 5 is a partial cross-sectional view illustrating a region in which a ceiling surface 44 (to be described later) is installed.

As illustrated in FIGS. 1 to 3, the film forming apparatus includes a flat process chamber 1 having a substantially circular planar shape, the susceptor 2 installed within the process chamber 1, and a control part (controller) 100 for controlling an overall operation (for example, a gas supply timing of the process gas nozzles 31 and 32) of the film forming apparatus.

The process chamber 1 has a vessel body 12 having a cylindrical shape with a bottom and a ceiling plate 11 airtightly and detachably disposed on an upper surface of the vessel body 12. For example, the ceiling plate 11 is airtightly and detachably disposed with a seal member 13 (FIG. 1.) such as an O-ring, and secures airtightness of the interior of the process chamber 1.

The susceptor 2 is fixed to a cylindrical core part 21 received in a case body 20 to rotate about the center of the process chamber 1. The susceptor 2 has a loading part formed on an upper surface thereof, and a plurality of substrates (hereinafter, referred to as "wafers") are loaded on the loading part.

The case body 20 is a cylindrical case with an upper surface thereof opened. The case body 20 is installed such that a flange portion installed on an upper surface thereof becomes airtight with a lower surface of a lower portion 14 of the process chamber 1. An internal ambiance of the case body 20 is isolated from an external ambiance.

The core part 21 is fixed to an upper end portion of a rotation shaft ending in a vertical direction. The rotational shaft 22 passes through the lower portion 14 of the process chamber 1. Further, a lower end portion of the rotational shaft 22 is installed in a driving part 23 for rotating the rotational shaft 22 around the vertical axis. Also, the rotational shaft 22 and the driving part 23 are received within the case body 20.

As illustrated in FIG. 3, a surface of the susceptor 2 has a plurality of circular concave portions 24 for loading a plurality of wafers (five wafers in this embodiment) thereon in a rotation direction (in a circumferential direction). Here, in FIG. 3, a wafer W is illustrated in only one concave portion 24 for the convenience of description. Also, the susceptor 2 that may be used in the present disclosure may be configured such that four or less, or six or more wafers W as a plurality of substrates may be loaded thereon.

In this embodiment, the concave portion 24 may have an inner diameter (for example, an inner diameter greater than a diameter of the wafer W by 4 mm) slightly greater than a diameter (for example, 300 mm) of the wafer W. Also, the concave portion 24 may have a depth substantially equal to a thickness of the wafer W. Thus, in the film forming apparatus, when the wafer W is loaded on the concave portion 24, the surface of the wafer W and the surface of the susceptor 2 (region in which the wafer W is not loaded) may be substantially the same in height.

In the film forming apparatus, the process gas nozzle 31 is a first gas supply part, and is disposed in a first process region (to be described later) partitioned in an upper portion of the susceptor 2. The process gas nozzle 31 is used as a raw material gas supply nozzle for supplying a raw material gas to the wafer W. The process gas nozzle 32 is a second gas supply part, and used as a reaction gas supply nozzle for supplying a reaction gas that reacts with a raw material gas to generate a reaction product. The process gas nozzle 32 is disposed in a second process region (to be described later) spaced away from the first process region along the circumferential direction of the susceptor 2. The separation gas nozzles 41 and 42 are separation gas supply parts and are disposed between the first process region and the second process region (hereinafter, simply referred to as "gas nozzles 31, 32, 41, and 42") Also, nozzles formed of, for example, quartz, may be used as the gas nozzles 31, 32, 41, and 42.

Specifically, as illustrated in FIGS. 2 and 3, in the film forming apparatus, the process gas nozzle 32, the separation gas nozzle 41, the process gas nozzle 31, and the separation gas nozzle 42 are arranged in this order in a clockwise direction (the rotation direction of the susceptor 2) from a transfer port 15 for a substrate transfer at intervals in the circumferential direction of the process chamber 1. Gas introduction ports 31a, 32a, 41a, and 42a (FIG. 3) as base ends of the nozzles 31, 32, 41, and 42 are fixed to an outer circumferential wall of the vessel body 12. Further, the gas nozzles 31, 32, 41, and 42 are introduced from an outer circumferential wall of the process chamber 1 into the process chamber 1. Also, the gas nozzles 31, 41, and 42 are installed in a central direction of the susceptor 2 along a radial direction of the vessel body 12, and also installed to extend to be parallel to the susceptor 2.

The gas nozzles 31 and 32 have a plurality of gas discharge holes 33 (see FIG. 4) opened downwardly toward the susceptor 2. The openings of the gas nozzles 31 and 32 may be arranged at an interval of, for example, 10 mm, in a longitudinal direction of the nozzles. Thus, a lower region of the process gas nozzle 31 becomes a region in which a raw material gas is adsorbed to the wafer W (hereinafter, referred to as a "first process region P1"). Also, a lower region of the process gas nozzle 32 becomes a region (hereinafter, referred to as a "second process region P2"), in which a reaction gas is reacted to a raw material gas adsorbed to the wafer W and a reaction product of the raw material gas and the reaction gas is deposited. Since the first process region P1 is a region to which the raw material gas is supplied, it may be termed a "raw material gas supply region P1", and since the second process region P2 is a region to which the reaction gas that reacts with the raw material gas is supplied, it may be termed a "reaction gas supply region P2".

As the raw material gas, for example, an organic metal gas or the like used to form a high dielectric Film (high-k film) may be used, or a gas such as tri (dimethylamino) cyclopentadienylzirconium ($C_{11}H_{23}N_3Zr$) may be used. In addition, an organic metal gas generated by evaporating an organic metal compound containing a metal such as aluminum, hafnium, or titanium or semi-metal such as silane may also be used as the raw material gas. Also, as the reaction gas, a reaction gas such as an oxidizing gas (for example, an $O_2$ gas or an $O_3$ gas) or a nitriding gas may be used.

In general, an organic metal compound used as a raw material gas for forming a high-k film is a compound containing amine, and it contains an amino group (—$NH_2$, —NHR, —NRR'). For example, when the organic metal gas is oxidized by reaction with an oxidizing gas, the amino group is removed and a harmful gas is generated. In the method for detoxifying an exhaustpipe and the film forming apparatus according to this embodiment, a process is performed to sufficiently oxidize the amino group and detoxify a harmful gas, which will be described later. However, the raw material gas is not limited to the aforementioned gases, and various other gasses may also be used.

Figure 7:
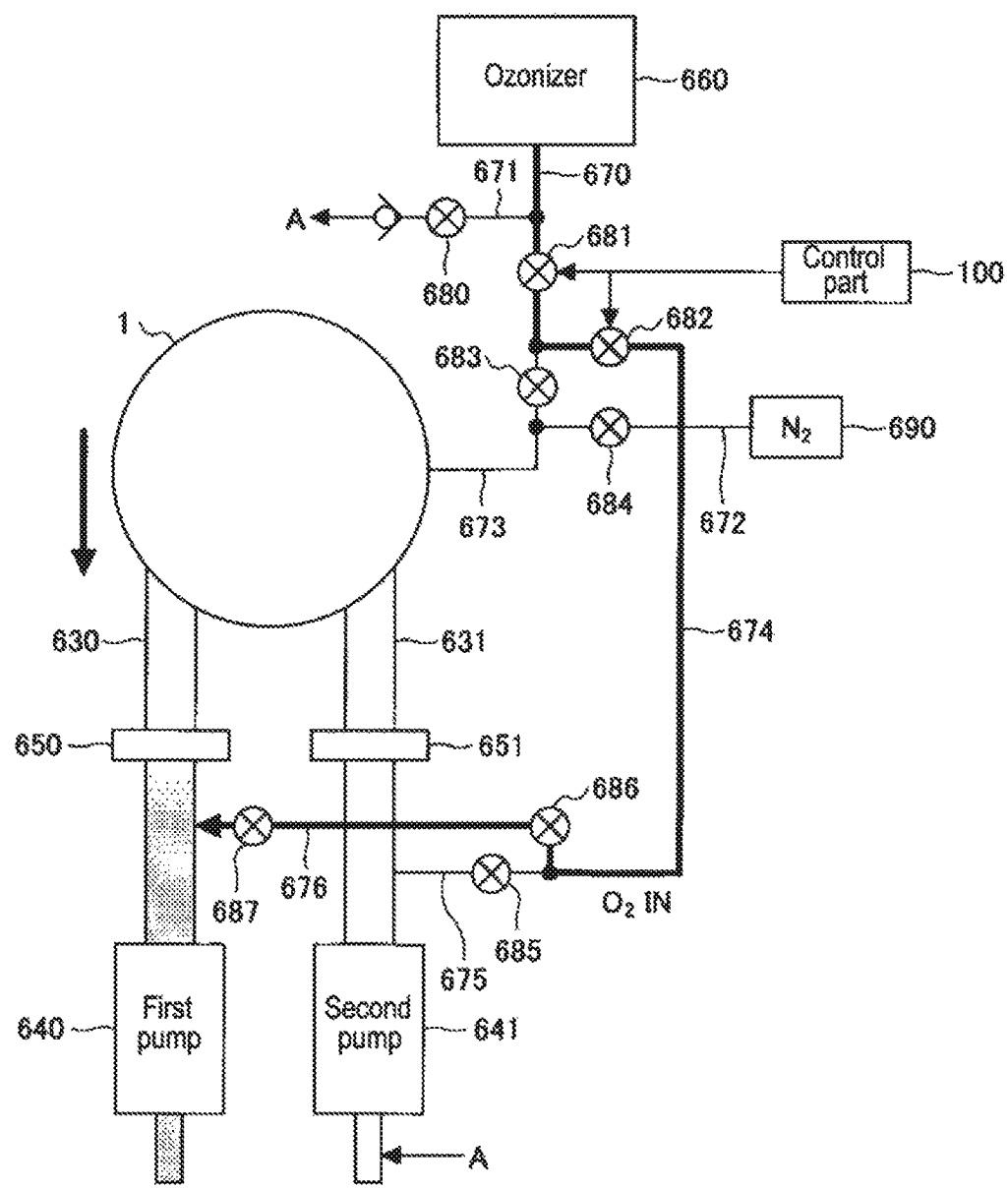
FIG. 7 is a diagram illustrating an overall configuration of an example of an exhaust system of the film forming apparatus according to an embodiment of the present disclosure.

The process gas nozzle 32 is disposed in the reaction gas supply region P2 partitioned in the upper side of the upper surface of the susceptor 2. As illustrated in FIG. 7, the process gas nozzle 32 is connected to an ozonizer 660 as a reaction gas supply source through pipes 670 and 673 and opening/closing valves 681 and 683. That is, the process gas nozzle 32 is configured to supply a reaction gas toward an upper surface of the susceptor 2. Specifically, the opening/closing valves 681 and 683 are opened and the opening/closing valves 682 and 684 are closed, so that it makes it possible to supply a reaction gas from the process gas nozzle 32 into the process chamber 1 (the second process region P2).

The separation gas nozzles 41 and 42 are installed between the first process region P1 and the second process region P2 formed to be spaced apart from each other in the circumferential direction, respectively. The separation gas nozzles 41 and 42 are connected to a separation gas supply source through a pipe (not shown) or the like. That is, the separation gas nozzles 41 and 42 are configured to supply a separation gas to the upper surface of the susceptor 2.

As the reaction gas, various reaction gases that are able to react with the raw material gas may be used. For example, a so-called oxidation gas containing oxygen may be used. In this embodiment, an example of using an oxidation gas as a reaction gas will be described. The oxidation gas is, for example, an oxygen gas, an ozone gas, or water vapor. That is, a raw material gas that is supplied from the process gas nozzle 31 and adsorbed to the substrate is oxidized by the reaction gas supplied from the process gas nozzle 32 to generate an oxide.

The film forming apparatus is configured to use an inert gas as a separation gas. The inert gas is, for example, a rare gas such as argon (Ar) or helium (He), or a nitrogen gas. The separation gas is used as a purge gas for purging the wafer W. Also, in this embodiment, an example in which an $N_2$ gas generally used as a purge gas is used as the separation gas will be described.

As illustrated in FIGS. 2 and 3, two convex shape portions 4 are formed within the process chamber 1 of the film forming apparatus. The convex shape portion 4 has a substantially fan-like planar shape with a top portion cut to have a circular arc shape. In this embodiment, in the convex shape portion 4, an inner circular arc is connected to a protrusion 5. Also, the convex shape portion 4 is disposed such that an outer circular arc follows an inner circumferential surface of the vessel body 12 of the process chamber 1.

Specifically, as illustrated in FIG. 4, the convex shape portion 4 is installed on a rear surface of the ceiling plate 11. Also, the convex shape portion 4 has a lower ceiling surface 44 (a first ceiling surface) that is a lower surface thereof and is flat, and a ceiling surface 45 (a second ceiling surface) positioned on both circumferential sides of the ceiling surface 44. Here, the ceiling surface 45 of the convex shape portion 4 is a ceiling surface higher than the ceiling surface 44. Thus, the convex shape portion 4 is configured to form a separation space H as a narrow space within the process chamber 1, and spaces 481 and 482 to which a gas is introduced from the separation space H. That is, the separation space H, which is a narrow space formed by the convex shape portion 4, serves as a separation region D illustrated in FIG. 2, which will be described later.

Further, as illustrated in FIG. 4, the convex shape portion 4 has a groove portion 43 at the center of the circumferential direction. The groove portion 43 extends in a radial direction of the susceptor 2. Also, the groove portion 43 accommodates the separation gas nozzle 42. Another convex shape portion 4 also has the groove portion 43, and the separation gas nozzle 41 is accommodated therein.

In addition, a gas discharge hole 42h is formed on a lower surface of the separation gas nozzle 42, that is, on a surface opposing the susceptor 2. A plurality of gas discharge holes 42h are formed at a predetermined interval (for example, 10 mm) in a longitudinal direction of the separation gas nozzle 42. Also, a diameter of an opening of the gas discharge hole 42*h* ranges from, for example, 0.3 to 1.0 mm. Although not shown, the gas discharge hole 42*h* is also formed in the separation gas nozzle 41.

Also, as illustrated in FIG. 4, in the film forming apparatus, the process gas nozzles 31 and 32 are installed in spaces below the higher ceiling surface 45, respectively, The process gas nozzles 31 and 32 are spaced apart from the ceiling surface 45 and installed near the water W. Also, as illustrated in FIG. 4, the process gas nozzle 31 is installed in a space 481 (space below the higher ceiling surface 45), and the process gas nozzle 32 is installed in a space 482 (space below the higher ceiling surface 45).

The process gas nozzles 31 and 32 are installed in the vicinity of the surface of the wafer W, and the discharge holes 33 are formed in lower surfaces of the process gas nozzles 31 and 32 to face the surface of the wafer W. A distance between the discharge holes 33 of the process gas nozzles 31 and 32 and a surface in which the concave portion 24 of the susceptor 2 is not formed is set to a range of, for example, 1 to 5 mm, and appropriately set to about 3 mm. Also, as illustrated in FIG. 4, the process gas nozzle 31 for supplying a raw material gas may have a rectangular cross-sectional shape. Also, another process gas nozzle 32 and the separation gas nozzles 41 and 42 may have a ring shape cross-section.

The lower ceiling surface 44 is configured to form a separation space H as a narrow space, with respect to the susceptor 2. When an inert gas (for example, an $N_2$ gas) is supplied from the separation gas nozzle 42, the inert gas flows into the separation space H and is discharged toward the space 481 and the space 482. Here, since a volume of the separation space H is smaller than that of the spaces 481 and 482, the film forming apparatus may be configured to increase a pressure of the separation space H by using the supplied inert gas, compared with a pressure of the spaces 481 and 482. That is, the separation space H is configured to form a pressure barrier in a gap between the spaces 481 and 482.

Further, the inert gas discharged from the separation space H to the spaces 481 and 482 acts as a counter flow with respect to a first process gas (raw material gas) of the first process region P1 and a second process gas (reaction gas) of the second process region P2. Thus, in the film forming apparatus, the first process gas of the first process region P1 and the second process gas of the second process region P2 are separated by using the separation space H. That is, in the film forming apparatus, the first process gas and the second process gas are restrained from being mixed to react to each other within the process chamber 1.

Further, a height h1 of the ceiling surface 44 with respect to the upper surface of the susceptor 2 may be a height appropriate for having a pressure of the separation space H higher than a pressure of the spaces 481 and 482*b* based on an internal pressure of the process chamber 1, a rotation speed of the susceptor 2, a supply amount of the separation gas ($N_2$ gas), and/or the like when a film is formed. Also, the height h1 of the ceiling surface 44 with respect to the upper surface of the susceptor 2 may be a height corresponding to a specification of the film forming apparatus and a type of the supplied gas. Also, the height h1 of the ceiling surface 44 with respect to the upper surface of the susceptor 2 may be a height determined through experimentation, calculation, or the like in advance.

As illustrated in FIGS. 2 and 3, the protrusion 5 is formed on a lower surface of the ceiling plate 11 to surround an outer circumference of the core part 21 for fixing the susceptor 2. In this embodiment, the protrusion 5 is connected with a portion of the rotation center side of the convex shape portion 4, and a lower surface thereof is formed to have the same height as that of the ceiling surface 44.

As illustrated in FIG. 2, a bent portion 46 is formed to be bent in an L shape to face an outer end surface of the susceptor 2 in a circumferential portion (an outer edge-side portion of the process chamber 1) of the convex shape portion 4 having a substantially fan shape. The bent portion 46 suppresses gas distribution between the space 481 and the space 482 through a space between the susceptor 2 and an inner circumferential surface of the vessel body 12. The fan-like convex shape portion 4 is installed on the ceiling plate 11.

In the film forming apparatus, since the ceiling plate 11 may be separated from the vessel body 12, a little gap is formed between an outer circumferential surface of the bent portion 46 and the vessel body 12. In the film forming apparatus, a gap between the inner circumferential surface of the bent portion 46 and the outer end surface of the susceptor 2 and a gap between the outer circumferential surface of the bent portion 46 and the vessel body 12 may be set to, for example, a dimension that is the same as the height of the ceiling surface 44 with respect to the upper surface of the susceptor 2.

Referring back to FIG. 3, a first exhaust port 610 that communicates with the space 481 (FIG. 4) and a second exhaust port 620 that communicates with the space 482 (FIG. 4) are formed between the susceptor 2 and the inner circumferential surface of the vessel body. The first exhaust 610 and the second exhaust 620 are connected to vacuum exhaust parts (for example, vacuum pumps 640 and 641) through exhaust pipes 630 and 631, respectively, as illustrated in FIGS. 1 and 7. In addition, pressure regulators 650 and 651 are installed in a path which is to the vacuum exhaust parts 640 and 641 of the exhaust pipes 630 and 631.

As illustrated in FIGS. 1 and 5, a heater part 7 as a heating means is installed in a space between the susceptor 2 and the lower portion 14 of the process chamber 1. The wafer W on the susceptor 2 is heated to a temperature (for example, 450 degrees C.) determined by a process recipe by the medium of the susceptor 2. A ring-shaped cover member 71 is installed at a lower side near the periphery of the susceptor 2 in order to suppress the entry of gas into a lower space of the susceptor 2.

As illustrated in FIG. 5, the cover member 71 includes an inner member 71*a* installed to face an outer edge portion of the susceptor 2 and an outer circumference side than the outer edge portion from a lower side, and an outer member 71*b* installed between the inner member 71*a* and an inner wall surface of the process chamber 1. The outer member 71*b* is installed to be close to the bent portion 46 at a lower side of the bent portion 46 formed at the outer edge portion of the convex shape portion 4. The inner member 71*a* surrounds the entire circumference of the heater part 7 at a lower side of the outer edge portion of the susceptor 2 (a lower side of a slightly outer portion than the outer edge portion).

Figure 6:
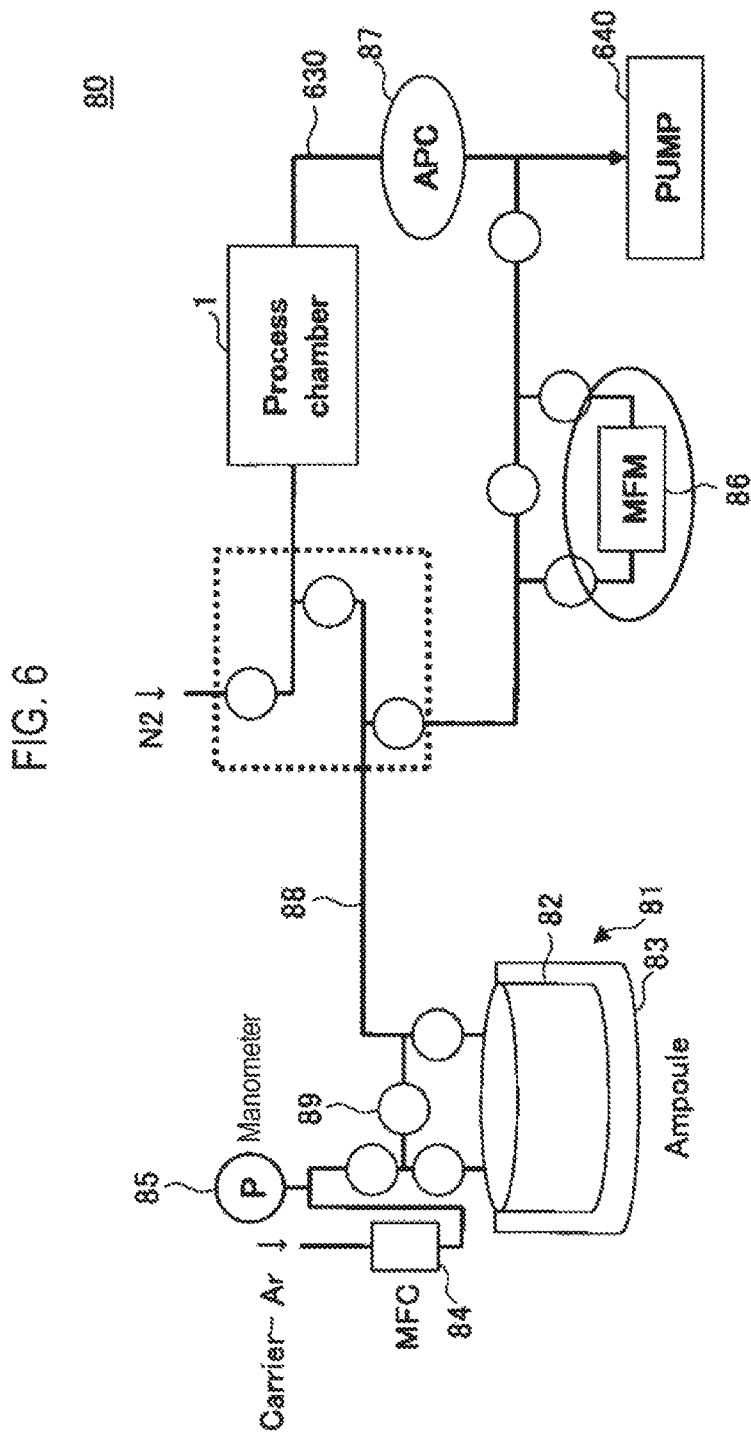
FIG. 6 is a diagram illustrating an example of a raw material supply system for supplying a raw material gas to a process gas nozzle of the film forming apparatus of FIG. 1.

FIG. 6 is a diagram illustrating an example of a raw material supply system for supplying a raw material gas to the process gas nozzle 31. The raw material supply system 80 is configured with an ampoule system including a vaporizer 81. The raw material supply system 80 includes the vaporizer 81, a mass flow controller 84, a manometer 85, a mass flow meter 86, an automatic pressure controller 87, a pipe 88, and a valve 89.

The vaporizer 81 is a device for vaporizing a liquid raw material, and includes a storage tank 82 and a heating part 83. Specifically, the liquid raw material formed of an organic metal stored in the storage tank 82 is heated by the heating part 83, and the vaporized liquid raw material is mixed with a carrier gas and supplied, as a raw material gas, to the process chamber 1 through the pipe 88. Also, a pressure of the carrier gas is measured by the manometer 85, and a flow rate thereof is controlled by the mass flow controller 84. As the carrier gas, a gas which does not have reactivity, such as a rare gas, may be used For example, an argon gas may he used. The carrier gas is mixed with the raw material gas vaporized by the vaporizer 81 by opening and closing of the valve 89 and supplied into the process chamber 1 from the process gas nozzle 31 through the pipe 88. The vaporized raw material gas is carried by the carrier gas, and supplied together with the carrier gas into the process chamber 1. Further, the raw material supply system 80 may have the automatic pressure controller 87 for automatically adjusting a pressure in the path of the exhaust pipe 630 installed to exhaust the interior of the process chamber 1 by the vacuum pump 640, and may also have the mass flow meter 86 in the path of the pipe 88.

The control part 100 illustrated in FIG. is a means for instructing each element of the film forming apparatus to operate, and controlling an operation of each element. In the film forming apparatus, the control part 100 is configured with a computer for controlling an overall operation of the apparatus. For example, the control part 100 executes a program stored in a storage part 101, and cooperates with hardware to form a film on a surface of a plurality of substrates. Also, the control part 100 may be configured with an execution processing device including a general central processing unit (CPU), a memory (for example, a ROM or a RAM), and the like.

Specifically, the control part 100 may store a program for performing a film forming method (to be described later) by the film forming apparatus in a built-in memory. The program may be formed with, for example, a step group. The control part 100 is configured to read out the program stored in a medium 102 (a hard disk, a compact disk, an optical magnetic disk, a memory card, a flexible disk, or the like) into the storage part 101, and then the program is installed in the control part 100.

As illustrated in FIG. 7, the control part 100 is configured to control a switching operation of the opening/closing valves 680 to 687 to determine a supply destination, that is, a connection destination, of the ozonizer 660 as an oxidation gas supply source. Thus, during a period other than a period for a film forming process in which an oxidation gas is not used in the film forming process, ozone is supplied to the raw material gas exhaust pipe 630 to detoxify harmful components of the raw material gas exhaust pipe 630.

Next, an exhaust system of the film forming apparatus according to an embodiment of the present disclosure will be described in more detail with reference to FIG. 7. FIG. 7 is a diagram illustrating an overall configuration of an example of an exhaust system in the film forming apparatus according to an embodiment of the present disclosure.

As described with reference to FIGS. 2 to 4, the first exhaust port 610 and the second exhaust port 620 communicate with the first process region P1 and the second process region P2, respectively. Thus, as illustrated in FIG. 7, the raw material gas exhaust pipe 630 and the reaction gas exhaust pipe 631 are independently connected to the process chamber 1. The raw material gas exhaust pipe 630 is connected to the first exhaust port 610, and the reaction gas exhaust pipe 631 is connected to the second exhaust port 620. Further, the raw material gas exhaust pipe 630 is connected to the vacuum pump 640 through the pressure regulator 650, and the reaction gas exhaust pipe 631 is connected to the vacuum pump 641 through the pressure regulator 651.

The ozonizer 660 is connected to the process chamber 1 through the pipes 670 and 673 and the opening/closing valves 681 and 683, and also connected to an upstream side of the raw material gas exhaust pipe 630 prior to the vacuum pump 640 through the pipes 670, 674, and 675, and the opening/closing valves 681, 682, 686, and 687. Further, the ozonizer 660 is connected to an upstream side of the reaction gas exhaust pipe 631 prior to the vacuum pump 641 through the pipes 670, 674, and 675 and the opening/closing valves 681, 682, and 685 and also connected to a downstream side of the reaction gas exhaust pipe 631 next to the vacuum pump 641 through the pipes 670 and 671 and the opening/closing valve 680. Also, in FIG. 7, a downstream end portion A of the pipe 671 indicates the connection to a location A denoted at the downstream side of the vacuum pump 641 of the reaction gas exhaust pipe 631. Also, the ozonizer 660 is an example of an oxidation gas supply source for supplying an ozone gas, and when other oxidation gas such as oxygen or water is supplied, a different oxidation gas supply source may be used.

The opening/closing valves 680 to 687 serve as a connection switching means for switching a supply source of the ozone gas generated by the ozonizer 660. That is, the connection of the ozonizer 660 to the pipes 670 to 676 is switched by a switching operation of the opening/closing valves 680 to 687 to determine a supply path.

The control part 100 controls a switching operation of the opening/closing valves 680 to 687 to switch a connection destination of the ozonizer 660, thereby controlling the supply destination. In this embodiment, the control part 100 controls whether to connect the ozonizer 660 to the process chamber 1 or to the raw material gas exhaust pipe 630. During a film forming process, the ozone gas is used as a reaction gas, and thus, the control part 100 controls supply of the ozone gas into the process chamber. Specifically, the control part 100 controls the opening of the opening/closing valves 681 and 683 and closing of the opening/closing valves 682 and 684. Meanwhile, other than the film forming process, it is not needed to supply the ozone gas in the process chamber, for example, during a substrate loading period in which the wafer W is loaded into the process chamber 1, during a film forming process preparation period in which a pressure is adjusted and each gas is prepared to be supplied after all the wafers W are loaded into the process chamber 1, during a post-processing period in which only a nitrogen gas is supplied after the supply of the raw material gas and the ozone gas is completed after the film forming process is completed, a substrate unloading period in which the wafer W is unloaded from the process chamber 1, and the like. During these periods in which the supply of the ozone gas into the process chamber 1 is not needed, the control part 100 operates to connect the ozonizer 660 to the raw material gas exhaust pipe 630 to supply the ozone gas to the raw material gas exhaust pipe 630. Thus, the raw material gas, which is not completely exhausted by the pump 640 and attached to and remaining within the raw material gas exhaust pipe 630, is sufficiently oxidized, so that amine as a harmful component can be detoxified. Also, in this case, the control part 100 operates so as to open the opening/closing valves 681, 682, 686, and 687, and close the opening/closing valves 683 and 685. Thus, the ozone gas generated by the ozonizer 660 is supplied to the raw material gas exhaust pipe 630 to detoxify the raw material gas remaining within the raw material gas exhaust pipe 630 and the vacuum pump 640. Here, a pipe path including the pipes 670, 674, and 676 for connecting the ozonizer 660 and raw material gas exhaust pipe 630 may also be called a bypass pipe or a bypass path.

Further, when the raw material gas exhaust pipe 630 is detoxified, the opening/closing valve 684 may be open and a purge gas (for example, a nitrogen gas) from a purge gas supply source 690 may be supplied into the process chamber 1 to prevent the ozone gas from flowing back to the process chamber 1.

In addition, the control part 100 also controls the opening/closing valves 680 and 685 other than the opening/closing valves 681, 682, 683, 684, 686, and 687 related to the connection destination of the ozonizer 660. The pipes 671 and 675 and the opening/closing valves 680 and 685 are means for connecting the ozone generated by the ozonizer 660 to the reaction gas exhaust pipe 631, and for example, the ozone gas may be discharged to the reaction gas exhaust pipe 631 until the ozonizer 660 starts to operate and is stabilized in operation. The control part 100 may control such operation. Also, the control part 100 may control operations of the ozonizer 660, the pressure regulators 650 and 651, and the vacuum pumps 640 and 641 as necessary.

Figure 8:
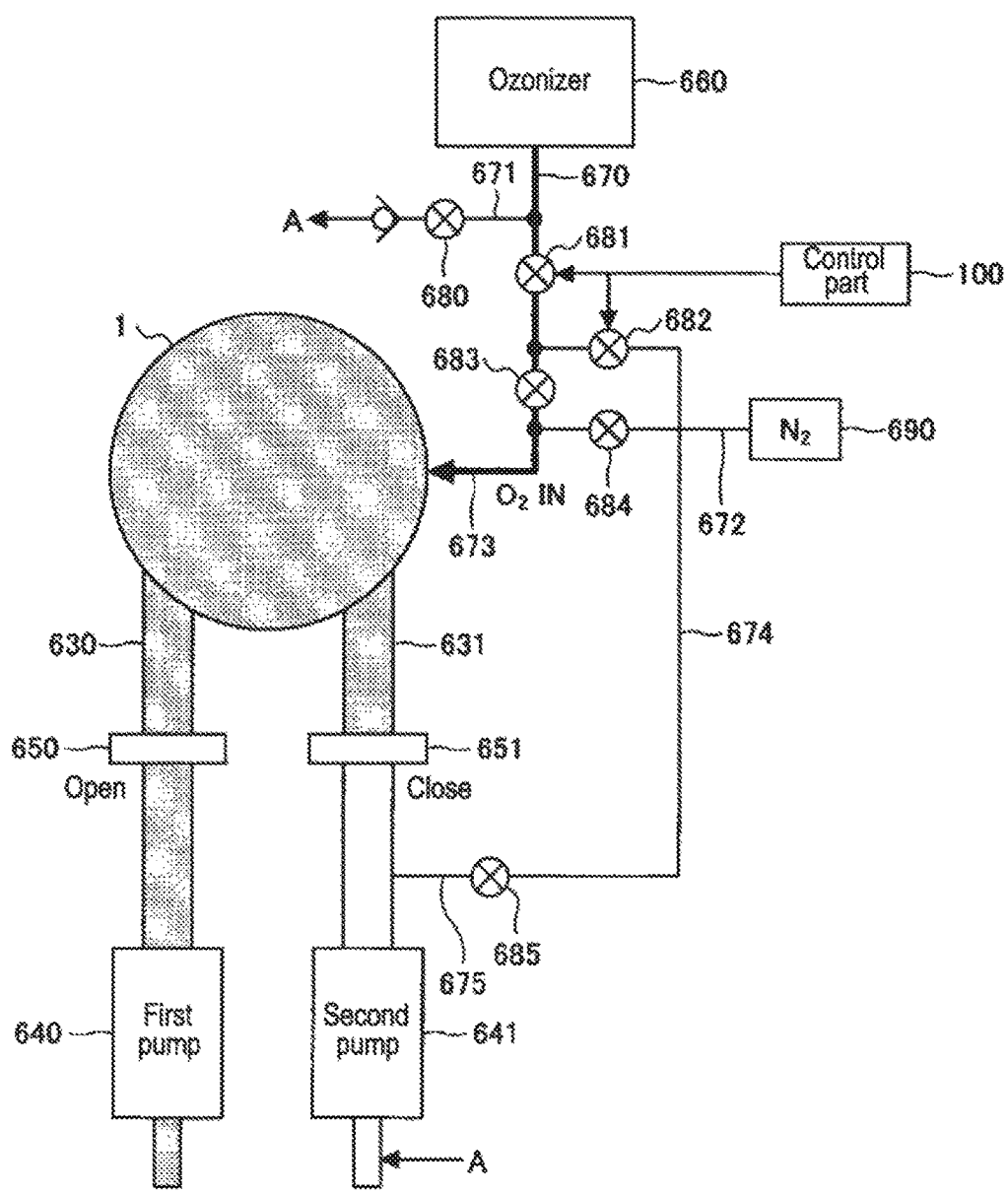
FIG. 8 is a diagram illustrating an exhaust system of the related art film forming apparatus.

FIG. 8 is a diagram illustrating an exhaust system of the related art film forming apparatus. In FIG. 8, the same reference numerals are used for the same elements as those of FIG. 7. In the exhaust system of the related art film forming apparatus, a bypass path for directly connecting the ozonizer 660 and the raw material gas exhaust pipe 630 is not present. Thus, in order to supply the ozone gas to the raw material gas exhaust pipe 630, the ozone gas needs to be supplied to the process chamber 1 and follow a path of supplying the ozone gas to the raw material gas exhaust pipe 630 through the process chamber 1. As mentioned above, the second exhaust port 620 directly communicates with the second process region P2 to which the ozone gas is supplied, but the first exhaust port 610 does not directly communicate with the second process region P2, and thus, in order to supply the ozone gas to the raw material gas exhaust pipe 630, the process chamber needs to be filled with the ozone gas while the pressure regulator 651 installed in a reaction gas exhaust pipe 631 is closed. In order to perform this operation, conventionally, the ozone gas needs to he continuously purge-supplied during the maintenance operation of the vacuum pump 640 where a film forming process is not performed. In order to detoxify the raw material gas exhaust pipe 630 and the vacuum pump 640, the purge supply of the ozone gas needs to be performed for a long period of time, which leads to an increase in a down time during which a film forming process may be not performed.

Thus, the film forming apparatus according to this embodiment is configured such that, the bypass pipes 670, 674, and 676 for connecting the ozonizer 660 and the raw material gas exhaust pipe 630 are installed, and even when film forming process is continuously performed, the ozone gas is directly supplied to the raw material gas exhaust pipe 630 using a gap time during which there is no need to supply the ozone gas to the process chamber 1, so that the raw material gas exhaust pipe 630 is detoxified without setting a down time. Thus, the raw material gas exhaust pipe 630 and the vacuum pump 640 may be detoxified without degrading throughput of the film forming process.

Subsequently, a sequence of a method for detoxifying an exhaust pipe according to an embodiment of the present disclosure will be described with reference to FIG. 9. FIG. 9 is a timing chart illustrating a sequence of an example of a method for detoxifying an exhaust pipe according to an embodiment of the present disclosure. In FIG. 9, a horizontal axis represents a passage of time, and a vertical item represents a supply destination of an oxidation gas. Also, in describing the sequence, details of a film forming process will also be described. Also, the exhaust system of the film forming apparatus described above with reference to FIG. 7 will be described as an example, and thus, a reaction gas supply source is the ozonizer 660 and a supplied reaction gas is the ozone gas, but the sequence may also be applied to a case in which the reaction gas supply source is a supply source of other oxidation gas or a nitride gas. Also, in describing the sequence, the elements described above will be given by the same reference numerals and descriptions thereof will be omitted.

First, during a time period of t1 to t2, the wafer W is loaded on each of the plurality of concave portions 24 formed on the upper surface of the susceptor 2. Specifically, first, a gate valve (not shown) is opened, and the wafer W is transferred into the concave portion 24 of the susceptor 2 through the transfer hole 15 using the transfer arm 10 (FIG. 3). When the concave portion 24 is stopped at a position facing the transfer hole 15, the wafer W is transferred by lifting a lifting pin (not shown) from a lower side of the process chamber 1 through a through hole of a lower surface of the concave portion 24. Further, the susceptor 2 is intermittently rotated to load the wafer W in each of the plurality of concave portions (five concave portions in this embodiment) 24 of the susceptor 2. Also, a time period of t1 to t2 may be termed a wafer loading period for loading the wafer W into the process chamber 1.

During the wafer loading period, as illustrated in FIG. 9, an ozone gas is supplied to the raw material gas exhaust pipe 630. Specifically, as illustrated in FIG. 7, the ozonizer 660 is connected to the raw material gas exhaust pipe 630 through the bypass pipes 670, 674, and 676, and a detoxifying process is performed on the raw material gas remaining within the raw material gas exhaust pipe 630 and the vacuum pump 640. Also, although the wafer loading period is different according to the contents of a recipe for determining detailed conditions of a film forming process, the wafer loading period may be set to, for example, about two minutes, and during this period, the raw material gas remaining in the raw material gas exhaust pipe 630 and the vacuum pump 640 are detoxified.

Thereafter, during a time period of t2 to t3, the interior of the process chamber 1 is set to a predetermined pressure, and a separation gas is then supplied into the process chamber 1. More specifically, a gate valve is closed, the process chamber 1 is exhausted to the lowermost degree of vacuum by using the vacuum pump 640, and then the separation gas for example, an $N_2$ gas) are supplied from the separation gas nozzles 41 and 42 at a predetermined flow rate. At this time, the separation gas is also supplied at a predetermined flow rate from the separation gas supply pipe 51 and the purge gas supply pipe 72 (FIG. 1). Also, an internal pressure of the process chamber 1 may be regulated to a preset process pressure by using the pressure regulators 650 and 651. Subsequently, the susceptor 2 is rotated in, for example, a clockwise direction to heat the wafer W by using the heater part 7. Also, since the time period of t2 to t3 is a preparation period before performing the film forming process, it may be termed a film forming process preparation period.

The time period of t2 to t3 is a first half of the film forming process preparation period, during which a pressure or the like is mainly regulated and a flow rate or concentration of the ozone gas generated by the ozonizer 660 is not adjusted.

Thus, during the wafer loading period, the ozone gas is supplied to the raw material gas exhaust pipe 630. Although it may be different according to a recipe, this time period may be set to, for example, about 2 minutes and 30 seconds.

Meanwhile, a time period of t3 to t4 is a second half of the film forming process preparation period, during which a flow rate and concentration of the ozone gas which has been generated by the ozonizer 660 are adjusted to be stabilized. Also in this case, the ozonizer 660 is connected to a downstream side of the reaction gas exhaust pipe 631 next to the vacuum pump 641, the stabilizing adjustment of the flow rate and concentration of the ozone gas is performed, and the ozone gas in the stabilizing process is discharged into the atmosphere.

Figure 10:
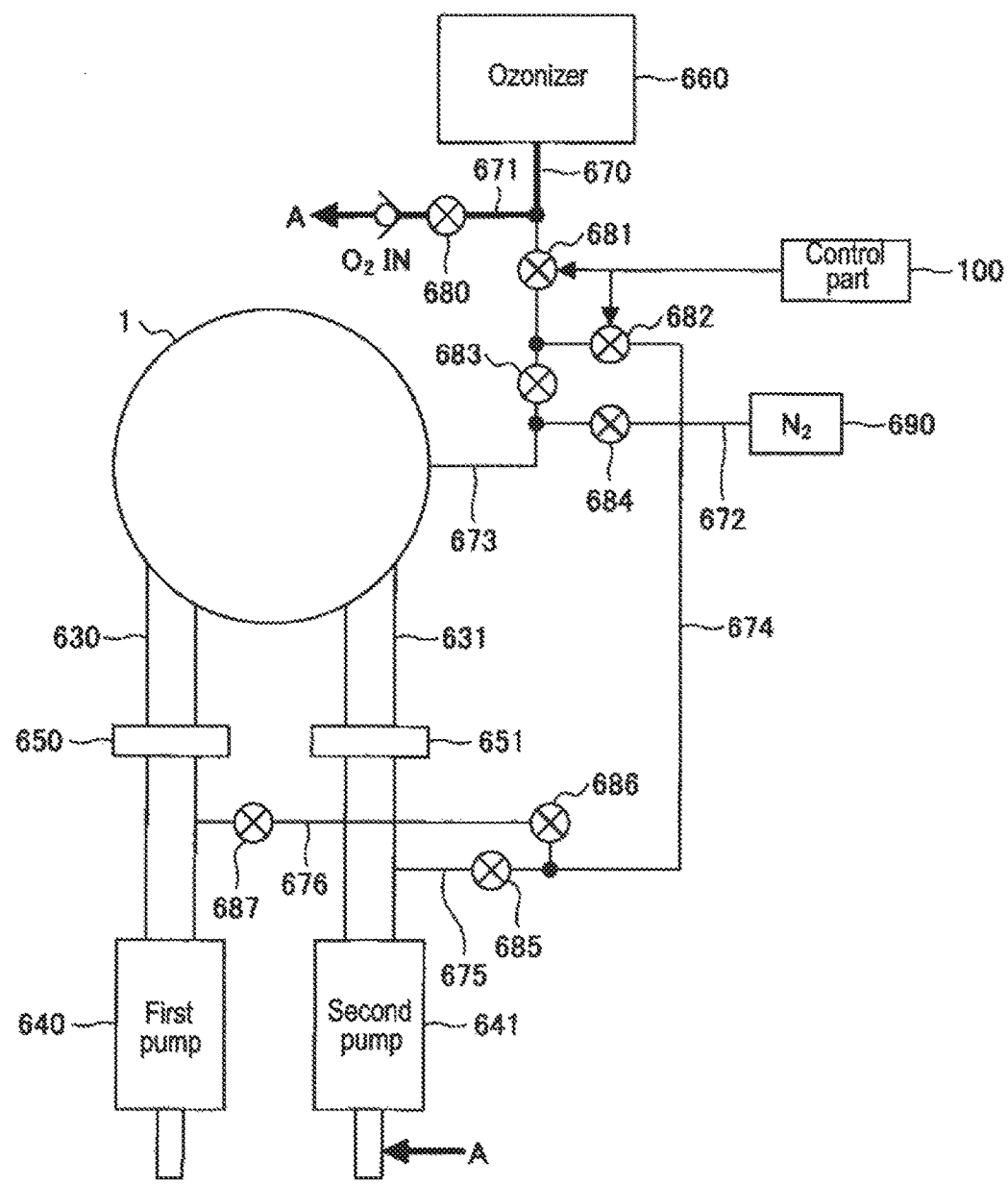
FIG. 10 is a diagram illustrating a connection of an ozonizer in performing stabilizing adjustment of a flow rate and concentration of an ozone gas.

FIG. 10 is a diagram illustrating a connection of the ozonizer 660 when the stabilizing adjustment of the flow rate and concentration of the ozone gas is performed. As illustrated in FIG. 10, the ozonizer 660 is connected to the downstream side of the reaction gas exhaust pipe 631 next to the vacuum pump 641, and the stabilizing adjustment of the flow rate and concentration of the ozone gas generated while being discharged into the atmosphere is performed. This adjustment is performed until the flow rate and concentration of the ozone gas generated by the ozonizer 660 are stabilized, and thus, time duration therefor is not particularly determined in many cases.

Subsequently, during a time period of t4 to t5 of FIG. 9, a film forming process is performed. That is, the time period of t4 to t5 is a film forming process period. During the film forming process period, the supply of a process gas from the process gas nozzle 31 and the process gas nozzle 32 is started. Specifically, a raw material gas is supplied from the process gas nozzle 31, and the ozone gas is supplied from the process gas nozzle 32.

Figure 11:
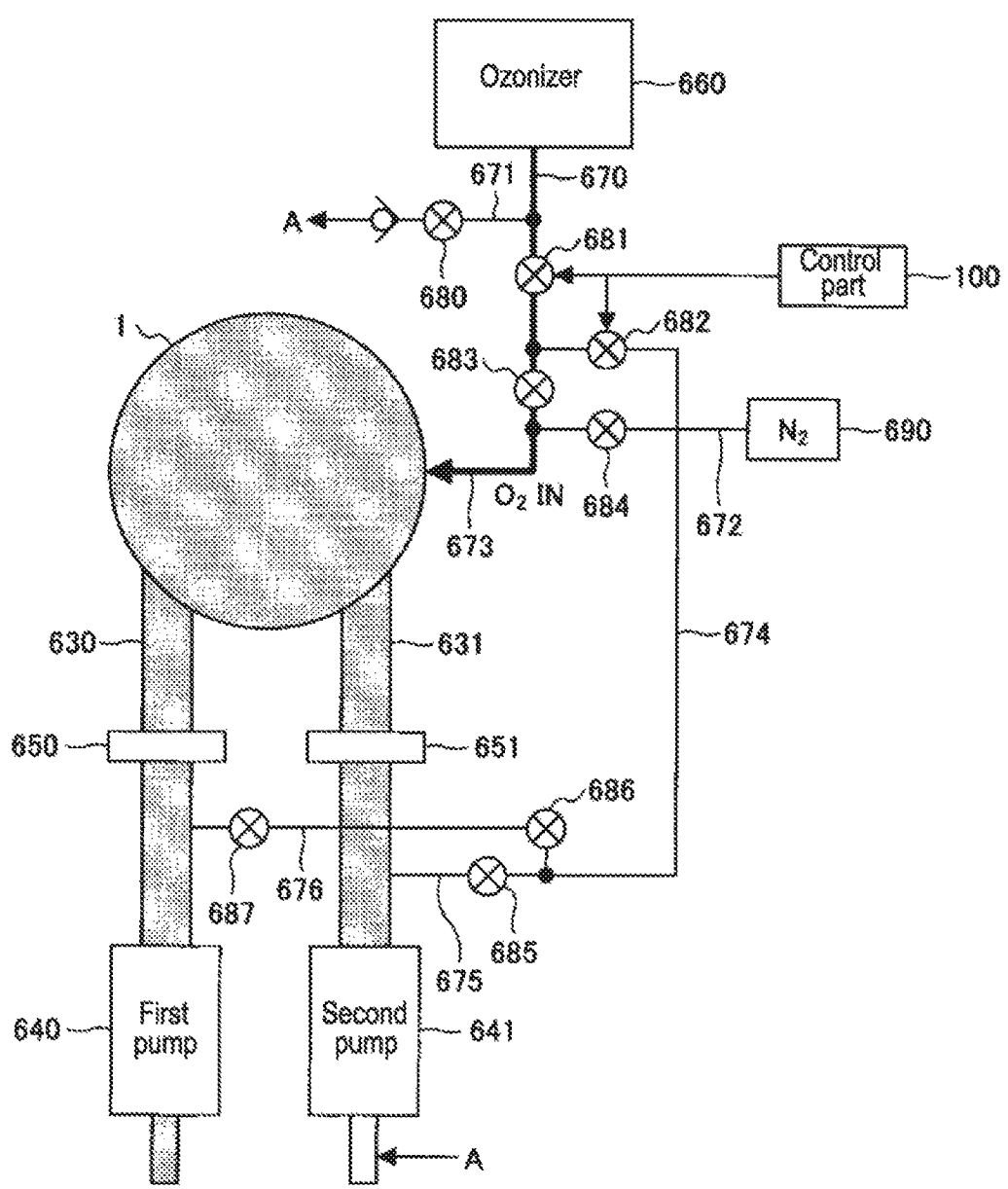
FIG. 11 is a diagram illustrating a supply path of an ozone gas from an ozonizer during a film forming process period.

FIG. 11 is a view illustrating a supply path of the ozone gas from the ozonizer 660 during the film forming process period. Since the opening/closing valves 681 and 683 are opened, and the opening/closing valves 682 and 684 are closed by the control part 110, the ozonizer 660 is connected to the process chamber 1 to form a supply path of the ozone gas.

The wafer W is processed by the start of supplying the process gas. A raw material gas is supplied from the process gas nozzle 31 within the first process region P1 and adsorbed onto the surface of the wafer W, and an oxidation gas (specifically, an ozone gas) that reacts with the raw material gas adsorbed onto the wafer W is supplied from the process gas nozzle 32 within the second process region P2. And, a reaction product between the raw material gas and the oxidation gas is deposited on the wafer W, and a molecular layer is deposited on the wafer W. Further, as the susceptor 2 is rotated, the wafer W periodically passes through the first process region P1, the separation region D, the second process region P2, and the separation region D, and whenever the wafer W passes through these regions, film formation is performed.

Here, the raw material gas supplied from the first process gas nozzle 31 is supplied by using, for example, the raw material supply system 80 described above with reference to FIG. 6. Specifically, when the raw material gas is an organic metal gas for forming a high dielectric film (a so-called high-k film), the supply of the raw material gas is performed by using the raw material supply system 80 and a liquid raw material of an organic metal compound as a raw material.

When a film thickness reaches a predetermined film thickness by continuously performing the film formation, the supply of the raw material gas from the process gas nozzle 31 is stopped, and the supply of the oxidation gas is continuously performed from the process gas nozzle 32 as necessary, to treat the film. Also, the treatment may not be performed when it is not necessary, and the supply of the first process gas and the supply of the second process gas may be simultaneously stopped. During the film forming process period of t4 to t5, the ozone gas is supplied into the process chamber 1.

A time period of t5 to t7 is a post-processing period. During a first half of the time period of t5 to t6 of the post-processing period, a purge gas supply process is performed and a separation gas (purge gas) is supplied into the process chamber 1 to purge the interiors of the pipe 673, the process chamber 1, the raw material gas exhaust pipe 630, and the reaction gas exhaust pipe 631. That is, almost the entire area of the gas path of the film forming apparatus is purged. During the purge period, it is not necessary to supply the ozone gas, and thus, the ozonizer 660 is stopped to stop the operation of generating the ozone gas from the oxygen gas. Further, the oxygen gas introduced into the ozonizer 660 is discharged in the atmosphere from a downstream side of the reaction gas exhaust pipe 631 next to the vacuum pump 641. Also, when the interiors of the pipe 673, the process chamber 1, the raw material gas exhaust pipe 630, and the reaction gas exhaust pipe 631 are sufficiently purged, the purge gas supply process is completed. Also, a connection of the ozonizer 660 during the purge process is the same as shown in FIG. 10.

A time period of t6 to t7 is the second half of the post-processing period, but a preparation operation required before unloading the wafer W, such as returning a position of the susceptor 2 to a position when the wafer is loaded or slightly increasing an internal pressure of the process chamber 1, is performed. During the period of the wafer unloading preparation operation, since the supply of the purge gas separation gas) into the process chamber 1 is also stopped, and it becomes a state capable of supplying the ozone gas to the raw material gas exhaust pipe 630, the supply of the ozone gas to the raw material gas exhaust pipe 630 is started at this stage. Also, a supply path of the ozone gas from the ozonizer 660 is the same as described above with reference to FIG. 7.

Thereafter, during a time period of t7 to t9, the wafer W is unloaded and loaded. During the time period for unloading and loading the wafer W, the supply of the ozone gas from the ozonizer 660 to the raw material gas exhaust pipe 630 is continuously performed, so that the detoxifying process on the raw material gas exhaust pipe 630 and the vacuum pump 640 continues.

During a time period of t7 to t8, the wafer W is unloaded from the process chamber 1 in reverse order of the loading of the wafer W. Specifically, a gate valve (not shown) is opened, and the film-formed substrate W is unloaded through the transfer hole 15 by using the transfer arm 10 (FIG. 4). As in the loading process, the wafer W is unloaded by using a lifting pin (not shown), or the like. The time period of t7 to t8 for unloading the wafer may also be termed a wafer unloading period.

During a time period of t8 to t9, like the time period of t0 to t1, the wafer W is loaded into the process chamber 1. Details thereof are the same as those during the time period of t0 to t1 described above. Also, during this time period, the supply of the ozone gas from the ozonizer 660 to the raw material gas exhaust pipe 630 is continuously performed, to detoxify the raw material gas exhaust pipe 630 and the vacuum pump 640.

In this manner, the wafer W y be unloaded during the time period of t7 to t8, the wafer W may be loaded during the time period of t8 to t9, the supply of the ozone gas from the ozonizer 660 to the raw material gas exhaust pipe 630 may be continued, and the raw material gas exhaust pipe 630 and the vacuum pump 640 may be continuously detoxified.

Further, as for the loading and unloading of the wafer W, the unloading and loading operations may be alternately performed such that when one wafer W is unloaded, another wafer W is loaded to the concave portion 24 from which the one wafer W has been unloaded, rather than unloading all of a plurality of wafers W and then loading a plurality of wafers W. In this case, the number of vertical movements of the lifting pin and a moving distance of the transfer arm 10 may be reduced, thereby shortening a tact time. In this case, the time t8 dividing this time period into the unloading period and the loading period is not present, and a short unloading period and a short loading period are alternately repeated until all of the wafers W are unloaded and loaded. In this case, the entire time period of t7 to t9 corresponds to the unloading period and loading period of the wafers, that is, the transfer period, but since the process of supplying the ozone gas to the raw material gas exhaust pipe 630 continuously is the same as that in the unloading period and the loading period, this period may also be treated as the transfer period in terms of the detoxifying process.

A time period of t9 to t11 is a film forming process preparation period in the film forming process based on a second recipe, and details thereof are the same as those described above regarding the time period of t2 to t3. During this time period, the supply of the ozone gas from the ozonizer 660 to the raw material gas exhaust pipe 630 is continuously performed, so that the detoxifying process on the raw material gas exhaust pipe 630 and the vacuum pump 640 continues.

During the time period of t6 to f10, the ozone gas from the ozonizer 660 to the raw material gas exhaust pipe 630 is continuously supplied, and in the example of FIG. 9, the detoxifying process on the raw material gas exhaust pipe 630 and the vacuum pump 640 are continuously performed for six minutes. Since this detoxifying process is continuously performed in every film forming cycle of the wafer W, the detoxifying process can be sufficiently performed on the raw material gas exhaust pipe 630 and the vacuum pump 640 without stopping the film forming process. Thus, the detoxifying process can be appropriately performed on the raw material gas exhaust pipe 630 and the vacuum pump 640, while a down time is eliminated and high productivity is realized.

This operation of performing the detoxifying process during the predetermined time period may be realized by controlling switching of the opening/closing valves 680 to 687 by the control part 100 based on a recipe.

Also, a process during a time period of t10 to t14 is the same as that of the time period of t3 to t7, and thus, a description thereof will be omitted.

The method for detoxifying an exhaust pipe and the film forming apparatus according to an embodiment of the present disclosure may be applied to various raw material gases containing a harmful component.

FIG. 12 is a view illustrating examples of raw material gases to which the method for detoxifying an exhaust pipe and the film forming apparatus according to this embodiment may be applied. As illustrated in FIG. 12, the method for detoxifying an exhaust pipe and the film forming apparatus according to this embodiment may be applied to various amines containing an amino group.

FIG. 13 is a diagram illustrating a reaction formula of TMA, ZyALD™, TiMCTA, and 3DMASi, among the raw material gases illustrated in FIG. 12, with ozone. As illustrated in FIG. 13, the harmful amine-based gas may become extinct by reacting the TMA, ZyALD™, TiMCTA, and 3DMASi with ozone.

Meanwhile, when the raw material gas is reacted with water, the harmful amine-based gas is generated. That is, when the raw material gas is opened in the air while the raw material as remains in the raw material gas exhaust pipe 630, the raw material gas reacts with moisture in the air to generate a harmful amine-based gas. Thus, an oxidation gas is supplied into the raw material gas exhaust pipe 630 in advance, thereby preventing generation of an amine-based gas and detoxifying the raw material gas remaining within the raw material gas exhaust pipe 630.

Figure 14:
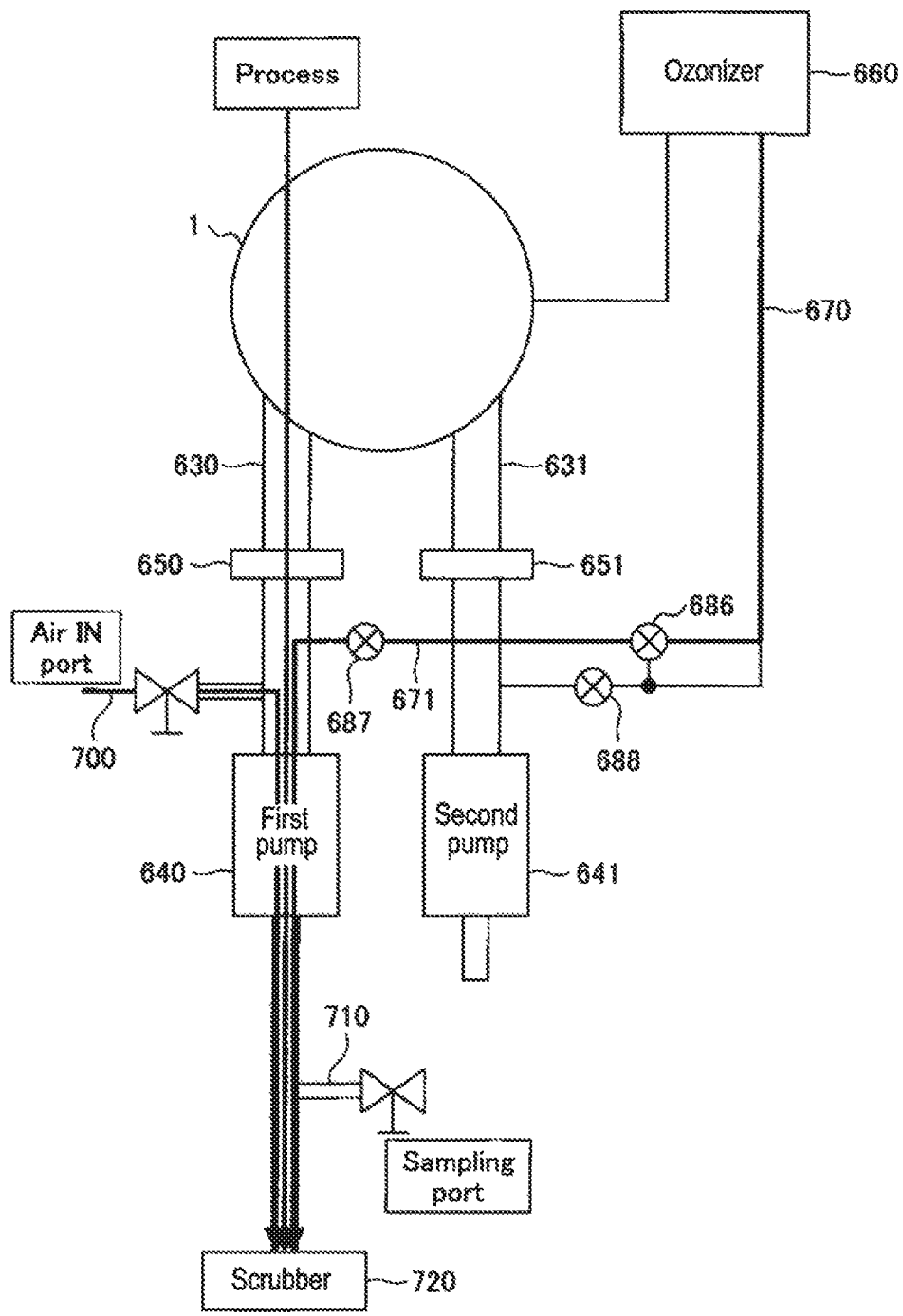
FIG. 14 is a diagram illustrating an embodiment for evaluating results When a method for detoxifying an exhaust pipe in the film forming apparatus according to an embodiment of the present disclosure is performed.

FIG. 14 is a view illustrating an embodiment for evaluating results when the method for detoxifying an exhaust pipe in the film forming apparatus according to an embodiment of the present disclosure is performed.

As illustrated in FIG. 14, the film forming apparatus according to this embodiment further includes an air supply port 700, a sampling port 710, and a scrubber 720, in addition to the elements described above with reference to FIG. 7. The air supply port 700 is a port for supplying air into the raw material gas exhaust pipe 630 and a means for rendering the raw material gas exhaust pipe 630 opened in the air. The sampling port 710 is a port for sampling an exhaust gas within the raw material gas exhaust pipe 630. The scrubber 720 is a cleaning means for cleaning the exhaust gas within the raw material gas exhaust pipe 630 so as to be discharged in the air.

First, a raw material gas containing zirconium (Zr) was supplied to the process chamber 1 for 25 minutes by using the film forming apparatus including the evaluation device to perform a film forming process. Next, ozone gas of 300 g was supplied from the ozonizer 660 to the raw material gas exhaust pipe 630 at a flow rate of 10 slm for four minutes, thereby performing the detoxifying method of the exhaust pipe according to this embodiment. In this stage, the exhaust gas from the sampling port 710 was sampled, and the content of an amine-based gas was measured by using an amine gas detector.

Thereafter, a purging process was performed by supplying an $N_2$ gas at a flow rate of 20 slm for five minutes, and subsequently, air was introduced from the air supply port 700 into the raw material gas exhaust pipe 630 to reproduce a state in which the raw material gas exhaust pipe 630 is opened in the air during the maintenance. Thereafter, the exhaust gas within the raw material gas exhaust pipe 630 from the sampling port 710 was sampled for 60 minutes, and the content of the amine-based gas was measured.

FIG. 15 is a diagram illustrating a result of performing the method for detoxifying an exhaust pipe according to this embodiment. The characteristic line Q indicates a comparative example that the method for detoxifying an exhaust pipe according to this embodiment is not performed, and an amine concentration is a value exceeding 40 ppm. Since the amine concentration is considered to be safe when it is equal to or less than 10 ppm, the value exceeding 40 ppm does not satisfy required safety.

Meanwhile, the characteristics line P shows the result of performing the method for detoxifying an exhaust pipe according to this embodiment, and an amine concentration is close to 0 ppm, satisfying the safety condition equal to or less than 10 ppm. Thus, according to the method for detoxifying an exhaust pipe regarding this embodiment, the exhaust gas within the raw material gas exhaust pipe 630 may be detoxified without having any down time.

According to the present disclosure in some embodiments, it is possible to detoxify an exhaust pipe of a raw material gas without having to stop a film forming process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of detoxifying an exhaust pipe in a forming apparatus configured to supply a raw material gas containing a harmful component and a reaction gas capable of generating a harmless reaction product by reaction with the raw material gas into a process chamber to perform a film forming process on a substrate while independently exhausting the raw material gas and the reaction gas from a raw material exhaust pipe and a reaction gas exhaust pipe connected to the process chamber, respectively, comprising:
supplying the reaction gas into the raw material exhaust pipe to detoxify an interior of the raw material exhaust pipe during a predetermined period in which the film forming apparatus is operated and the film forming process is not performed.

2. The method of claim 1, wherein the supplying the reaction gas into the raw material exhaust pipe is performed by switching a connection of a supply destination of the reaction gas supply source from the process chamber to the raw material exhaust pipe.

3. The method of claim 1, wherein the predetermined period includes at least one of a substrate loading period in which the substrate is loaded to the process chamber, a film forming preparation period before performing the film forming process from the substrate loading period, a post-processing period before starting unloading of the substrate after performing the film forming process, and a substrate unloading period in which the substrate is unloaded from the process chamber.

4. The method of claim 1, wherein the reaction gas is an oxidization gas.

5. The method of claim 4, wherein the oxidization gas is an oxygen gas or an ozone gas.

6. The method of claim 1, wherein the raw material gas is a gas containing an organic metal compound.

7. The method of claim 6, wherein the organic metal compound contains aluminum, zirconium, titanium, hafnium, or silane.

8. The method of claim 6, wherein the harmful component is a component containing an amino group.

9. The method of claim 1, wherein the film forming apparatus includes, within the process chamber, a rotary table configured to load a plurality of substrates on a surface thereof in a circumferential direction, a raw material gas supply region and a reaction gas supply region partitioned in the circumferential direction in an upper side of the rotary table, and a separation region formed between the raw material gas supply region and the reaction gas supply region,
wherein the raw material exhaust pipe and the reaction gas exhaust pipe are connected to the process chamber so as to be communicated with the raw material gas supply region and the reaction gas supply region, respectively, and
wherein the film forming process is performed by rotating the rotary table on which the substrate is loaded such that the substrate alternately passes through the raw material gas supply region and the reaction gas supply region via the separation region.

10. A film forming apparatus, comprising:
a process chamber;
a raw material gas supply region formed within the process chamber and configured such that a raw material gas containing a harmful component is supplied thereto;
a reaction gas supply region partitioned with the raw material gas supply region within the process chamber and configured such that a reaction gas capable of generating a harmless reaction product by reaction with the raw material gas is supplied thereto;
a raw material gas exhaust pipe connected to a point that communicates with the raw material gas supply region of the process chamber;
a reaction gas exhaust pipe connected to a point that communicates with the reaction gas supply region of the process chamber;
a raw material gas supply part configured to supply the raw material gas to the raw material gas supply region;
a reaction gas supply part configured to supply the reaction gas to the reaction gas supply region;
a reaction gas supply source connected to the reaction gas supply part;
a bypass pipe configured to connect the reaction gas supply source to the raw material gas exhaust pipe;
a connection switching part configured to switch a connection of the reaction gas supply source to the reaction gas supply part or to the bypass pipe; and
a control part configured to control a connection switching operation of the connection switching part.

11. The apparatus of claim 10, wherein a rotary table configured to load a plurality of substrates on a surface thereof in a circumferential direction is installed within the process chamber,
wherein the raw material gas supply region and the reaction gas supply region are formed to be spaced apart from each other in the circumferential direction in an upper side of the rotary table, and a separation region is formed between the raw material gas supply region and the reaction gas supply region,
wherein a film forming process is performed to deposit a reaction product oh the plurality of substrates by rotating the rotary table on which the plurality of substrates are loaded and alternately passing the plurality of substrates through the raw material gas supply region and the reaction gas supply region via the separation region, while supplying the raw material gas from the raw material gas supply part to the raw material gas supply region and simultaneously supplying the reaction gas from the reaction gas supply part to the reaction gas supply region, and
wherein the control part is configured to operate the connection switching part to connect the reaction gas supply source to the bypass pipe during a predetermined period in which the film forming process is not performed.

12. The apparatus of claim 11, wherein the control part is configured to operate the connection switching part to connect the reaction gas supply source to the bypass pipe during at least one period of a substrate loading period in which the substrate is loaded to the process chamber, a film forming preparation period before performing the film forming process from the substrate loading period, a post-processing period before starting unloading of the substrate after performing the film forming process, and a substrate unloading period in which the substrate is unloaded from the process chamber.

* * * * *